United States Patent
Vullaganti et al.

(10) Patent No.: US 7,479,800 B1
(45) Date of Patent: Jan. 20, 2009

(54) VARIABLE IMPEDANCE SENSE ARCHITECTURE AND METHOD

(75) Inventors: Kalyana C. Vullaganti, Dallas, TX (US); Jeffery Scott Hunt, Ackerman, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 1 day.

(21) Appl. No.: 11/540,831

(22) Filed: Sep. 28, 2006

Related U.S. Application Data

(60) Provisional application No. 60/722,612, filed on Sep. 29, 2005.

(51) Int. Cl.
*H03K 17/16* (2006.01)
*H03K 19/003* (2006.01)

(52) U.S. Cl. .......................... 326/30; 326/21
(58) Field of Classification Search ............. 326/21, 326/30
See application file for complete search history.

(56) References Cited

U.S. PATENT DOCUMENTS

| | | | |
|---|---|---|---|
| 5,917,335 A | 6/1999 | Rees ........................ 326/27 |
| 6,225,819 B1 | 5/2001 | Rees et al. ................ 326/30 |
| 6,384,621 B1* | 5/2002 | Gibbs et al. .............. 326/30 |
| 6,426,651 B1* | 7/2002 | Mandal et al. ............ 326/63 |
| 7,084,662 B1 | 8/2006 | Om et al. .................. 326/30 |
| 2004/0017220 A1* | 1/2004 | To et al. ................... 326/30 |
| 2004/0021481 A1* | 2/2004 | Ohno ....................... 326/30 |
| 2005/0040845 A1* | 2/2005 | Park ......................... 326/30 |
| 2006/0158213 A1* | 7/2006 | Allan ....................... 326/30 |

* cited by examiner

*Primary Examiner*—Rexford Barnie
*Assistant Examiner*—Jason Crawford

(57) ABSTRACT

A variable impedance sense (VIS) circuit (600) can detect and store an input offset value inherent in a sensing loop (620 and/or 622). According to a detected input offset polarity, a resulting impedance matching binary code can be adjusted to compensate for error that can be introduced by the input offset. The binary code can also be adjusted to compensate for additional error that can be introduced by dropping a least significant bit (LSB) of the code to reduce noise effects caused by the switching of the LSB.

19 Claims, 15 Drawing Sheets

|  | Worst case Error | | |
|---|---|---|---|
|  |  | Update Mode | |
|  | Initial Calibration | Drift-Down (Count-Up) | Drift-Up (Count-Down) |
| Positive Offset (Systematic) | 2LSB − Offset | 2LSB − Offset | 2LSB − Offset |
| Positive Offset (Random) | $\sqrt{[(2*\partial LSB)^2 + (\partial Offset)^2]}$ | $\sqrt{[(2*\partial LSB)^2 + (\partial Offset)^2]}$ | $\sqrt{[(2*\partial LSB)^2 + (\partial Offset)^2]}$ |
| Negative Offset (Systematic) | 2LSB − Offset | 2LSB − Offset | 2LSB − Offset |
| Negative Offset (Random) | $\sqrt{[(2*\partial LSB)^2 + (\partial Offset)^2]}$ | $\sqrt{[(2*\partial LSB)^2 + (\partial Offset)^2]}$ | $\sqrt{[(2*\partial LSB)^2 + (\partial Offset)^2]}$ |

FIG. 8

| | With OLD Architecture | With Proposed NEW Architecture | Error Improvement |
|---|---|---|---|
| PU-RQ Mismatch | | | |
| Systematic | 2LSB + Offset | 2LSB − Offset | 2*Offset |
| Random | √[(2*∂LSB)² + (∂Offset)²] | √[(2*∂LSB)² + (∂Offset)²] | 0 |
| PD-PU Mismatch | | | |
| Systematic | 3LSB + Offset | 3LSB − Offset | 2*Offset |
| Random | √[(3*∂LSB)² + (∂Offset)²] | √[(3*∂LSB)² + (∂Offset)²] | 0 |
| PD-RQ Mismatch | | | |
| Systematic | 4LSB + 2*offset | 3LSB + 2*offset | 1LSB |
| Random | √[(4*∂LSB)² + (2*∂Offset)²] | √[(3*∂LSB)² + (2*∂Offset)²] | |

FIG. 9

(For Comparator Input offset = +/- 5mv, Overdrive=0.5mv)

| # | Vddq (v) | Vref (v) Systematic | Vref (v) Random | % Improvement in the absolute error With LSB Drop | %SAVINGS in Error Budget 15% spec | %SAVINGS in Error Budget 10% Spec |
|---|---|---|---|---|---|---|
| 1 | 1.2 | 0.6 | 0.993 | 3.02 | 20.13 | 30.02 |
| 2 | 1.5 | 0.75 | 0.993 | 2.42 | 16.13 | 24.2 |
| 3 | 1.8 | 0.9 | 0.993 | 2.02 | 13.47 | 20.2 |
| 3 | 2.5 | 1.25 | 0.993 | 1.44 | 9.6 | 14.4 |
| 4 | 3.3 | 1.65 | 0.993 | 1.10 | 7.33 | 11.0 |

FIG. 10

| IO Standard | VDDIO (V) | PU/PD | | % OFFSET | | With OLD Architecture | With NEW Architecture | Delta % mismatch | Error savings as % of (15% spec) | Error savings as % of (10% spec) |
|---|---|---|---|---|---|---|---|---|---|---|
| | | | | Systematic | Random | Total % mismatch | Total % mismatch | Total | | |
| HSTL | 1.3 | PU | P-Offset | -1.68 | 1.95 | 6.89 | 6.89 | 0.00 | 18.53 | 27.80 |
| | | | N-Offset | 1.39 | 2.01 | 9.98 | 7.20 | 2.78 | | |
| | | PD | P-Offset | 1.39 | 2.01 | 8.23 | 8.23 | 0.00 | 22.40 | 33.60 |
| | | | N-Offset | -1.68 | 1.95 | 11.27 | 7.91 | 3.36 | | |
| LVTTL | 3.7 | PU | P-Offset | -0.59 | 1.98 | 7.30 | 7.30 | 0.00 | 6.53 | 9.80 |
| | | | N-Offset | 0.49 | 2.00 | 8.39 | 7.41 | 0.98 | | |
| | | PD | P-Offset | 0.49 | 2.00 | 6.91 | 6.91 | 0.00 | 7.87 | 11.80 |
| | | | N-Offset | -0.59 | 1.98 | 7.97 | 6.79 | 1.18 | | |

FIG. 11

| | Worst case Error | | |
|---|---|---|---|
| | Initial Calibration | Update Mode | |
| | | Drift-Down (Count-Up) | Drift-Up (Count-Down) |
| Positive Offset (Systematic) | 2LSB − Offset | 2LSB − Offset | 2LSB − Offset |
| Positive Offset (Random) | $\sqrt{[(2*\partial LSB)^2 + (\partial Offset)^2]}$ | $\sqrt{[(2*\partial LSB)^2 + (\partial Offset)^2]}$ | $\sqrt{[(2*\partial LSB)^2 + (\partial Offset)^2]}$ |
| Negative Offset (Systematic) | 2LSB + Offset | 2LSB + Offset | 2LSB + Offset |
| Negative Offset (Random) | $\sqrt{[(2*\partial LSB)^2 + (\partial Offset)^2]}$ | $\sqrt{[(2*\partial LSB)^2 + (\partial Offset)^2]}$ | $\sqrt{[(2*\partial LSB)^2 + (\partial Offset)^2]}$ |

FIG. 16 (BACKGROUND ART)

VARIABLE IMPEDANCE SENSE ARCHITECTURE AND METHOD

This application claims the benefit of U.S. provisional patent application Ser. No. 60/722,612 filed on Sep. 29, 2005, the contents of which are incorporated by reference herein.

TECHNICAL FIELD

The present invention relates generally to input/output (I/O) circuits, and more particularly to I/O circuits that can provide impedance matching by sensing a reference impedance value.

BACKGROUND OF THE INVENTION

Integrated circuits and other electronic devices can include input and/or output (I/O) connections for transmitting and receiving signals. As signal transmission speeds have increased, impedance matching has become an increasingly important feature in such devices. Matching impedance with external package and/or circuit board traces can improve the signal integrity and performance of both a signal transmitter and receiver.

In order to match signal line impedance, I/O circuits can include variable impedance circuits that can be adjusted as needed to match a sensed reference impedance value. Such circuits typically include a pull-up array of impedance devices (e.g., resistors) and/or a pull-down array of impedance devices (e.g., resistors). By selectively enabling such impedance devices, the impedance presented at the I/O can be calibrated to provide a target impedance.

One circuit that can be used in calibrating I/Os is a variable impedance sense (VIS) circuit. A VIS circuit can be used in I/O circuits to match the impedance of pull-up and pull-down arrays to an impedance of an external trace by sensing the resistance of an external reference impedance (e.g., reference resistor). The accuracy of impedance sense and matching circuit can be limited by the architecture and various error sources.

To better understand various features of the disclosed embodiments, a conventional VIS circuit will now be described with reference to FIG. 13.

A VIS circuit 1300 can include an external calibrating resistor RQ that is utilized to calibrate pull-up (PU) arrays 1302-0 and 1302-1, as well as a pull-down (PD) array 1304. PU arrays (1302-0 and 1302-1) and PD array 1304 are understood to be replicas of PU and PD arrays of actual I/O circuits (not shown) for which impedance matching is employed.

Each PU array and PD array can be composed of several pull-up and pull-down legs arranged in parallel. Each leg can represent a unit resistance, which can be established by a combination of transistors and/or a resistor. An impedance of a PU array or PD array can be set by turning on the appropriate number of legs in parallel. FIG. 13 shows a digital value (pu_dac[k:0] and pd_dac[k:0]) for both PU and PD arrays.

The VIS circuit 1300 also shows a switch circuit 1306. A switch circuit 1306 can selectively connect a reference voltage Vref, and voltages generated by PU array 1302-0, or PD array 1304 to inputs of a high gain comparator 1308. The switch circuit 1306 shown includes four switch elements SW_PU1, SW_PU2, SW_PD1, and SW_PD2.

Comparator 1308 has an output connected to a comparator register 1310. A comparator register 1310 can store an output value generated by comparator 1308.

The VIS circuit 1300 of FIG. 13 includes a calibration loop 1312 for a PU array as well as a calibration loop 1314 for a PD array. Further, the VIS circuit 1300 generates impedance matching values utilizing a successive approximation register (SAR) technique, and so includes SAR/counters (SAR/Counter) 1316-0 and 1316-1 for both such loops (1312 and 1314). A resulting value generated in the SAR/Counters 1316-0 and 1316-1 can be stored in update registers 1318-0 and 1318-1, respectively.

As is well understood, in a successive approximation technique, a "most" significant impedance leg can be switched into the circuit to create a voltage divider in conjunction with a reference impedance (e.g., RQ). A resulting voltage generated can be compared against a reference voltage. If the voltage is greater than the reference voltage (as determined by a comparator) a most significant bit can be set to a particular value (e.g., 1 or 0). In following cycle, a next significant impedance leg can be switched into the circuit to determine the value of the next most significant bit. This can continue until a final code is generated.

In the arrangement of FIG. 13, SAR/Counters (1316-0 and 1316-1) can operate as successive approximation registers or as up/down counters based on the mode of operation and the comparator output. The particular mode of operation can be established by control block 1320.

In an initial calibration cycle, a control block 1320 operates SAR/Counters (1316-0 and 1316-1) as successive approximation registers. However, in an update cycle (described in more detail below), SAR/Counters (1316-0 and 1316-1) can operate as up/down counters.

Final codes generated by VIS circuit 1300 (pucode[k:1] and pdcode[k:1]) can be provided to other I/O circuits via final update registers 1322-0 and 1322-1. As can be seen, and as will be discussed in more detail below, final codes (pucode[k:1] and pdcode [k:1]) can be generated by dropping a least significant bit (pu_dac[0] and pd_dac[0]) of a code stored in update registers 1318-0 and 1318-1, respectively.

The operation of the conventional VIS circuit 1300 will now be described.

A VIS circuit 1300 can be conceptualized as including two closed loops; one for the PU array calibration 1312 and another for the PD array calibration 1314. Each loop can include a resistive voltage divider digital-to-analog converter (DAC) and analog-to-digital converter (ADC). In the case of PU loop 1312, the DAC is formed by PU array 1302-0, which receives a digital code (pu_dac[k:0]), and reference resistor RQ, and provides a resulting analog voltage on reference node 1324. In the case of PD loop 1314, the DAC is formed by PU array 1302-1 and PD array 1304, which receives a digital code (pd_dac[k:0]), and provides a resulting analog voltage on reference node 1326.

In the case of PU loop 1312, the ADC is an SAR type ADC formed by comparator 1308, comparator register 1310, and SAR/Counter 1316-0, as controlled by control block 1320. Similarly, in the case of PD loop 1314, the ADC is an SAR type ADC formed by comparator 1308, comparator register 1310, and SAR/Counter 1316-1, as controlled by control block 1320.

In a calibration of the PU loop 1312, VIS circuit 1300 can determine a binary output code (pu_dac[k:0]) for PU arrays in the device by calibrating PU array 1302-0 against external reference resistor RQ. In a calibration of PD loop 1314, VIS circuit 1300 can determine a binary output code (pd_dac[k:0) for PD arrays in the device by calibrating PD array 1304 against an already calibrated PU array 1302-1. That is, once a calibrated pull-up code (pu_dac[k:0]) has been generated, such a code can be applied to PU array 1302-1, to enable it to act as a reference resistor for PD array 1304.

Initially, a PU loop 1312 can be enabled and a PD loop 1314 can be disabled. In such a state, switch elements SW_PU1/2 can be closed (i.e., low impedance) and switch elements SW_PD1/2 can be open (i.e., high impedance). An output of the PU voltage divider (1302-0/RQ) on reference node 1324 can be connected to a positive terminal of comparator 1308 and a reference voltage (Vref) can be connected to a negative terminal of comparator 1308. Resulting outputs of the comparator C1 can be used by SAR/Counter 1316-0 in an SAR type binary search algorithm to determine binary output code for the PU array (pu_dac[k:0]). In such an operation, comparator 1308 and SAR/Counter 1316-0 can act as an SAR ADC, which quantizes the analog input (output of the PU voltage divider) one bit (e.g., reference resistor leg) at a time. For each bit (starting from the MSB of pu_dac[k:0]), the ADC turns on the bit and checks the output of the DAC (PU voltage divider). If the output of comparator 1308 is HIGH, the bit can be turned off and the next bit can be turned on. If the output of comparator 1308 is LOW, a bit can be left on and the next bit can be turned on. This process can be repeated until all (in this case k+1) bits of the pull-up binary code (pu_dac[k:0]) have been determined. A final pull-up binary code can represent the number of pull-up legs required to match the impedance of PU array 1302-0 to the external resistor RQ.

Once PU array 1302-0 has been calibrated, the resulting code stored in update register 1318-0 can be output to reference PU array 1302-1, and PU loop 1312 can be disabled. Subsequently, PD loop 1314 can be enabled and, the same procedure (SAR technique) can be used to calibrate PD array 1304. Accordingly, switches SW_PD1/2 can be closed and switches SW_PU1/2 can be open. An output of the PD voltage divider (1302-1/1304) at reference node 1326 can be connected to a negative terminal of comparator 1308 and reference voltage Vref can be connected to a positive terminal of comparator 1308. A final pull-down binary code (pd_dac [k:0]) can be stored in update register 1318-1, and can represent the total number of pull-down legs required to match the impedance of PD array 1304 to calibrated PU array 1302-1. This can complete an initial calibration cycle.

However, while one set of calibration codes can provide an initial impedance match for I/Os of a device, operating conditions can result in changes (i.e., drift) in circuit components. In order to account for the variations in temperature and voltage, the pull-up and pull-down binary output codes (pu_dac [k:0] and pd_dac [k:0]) can be updated every "P" number of clock cycles. Such updates can be 1 bit updates that introduce a maximum of 1 LSB in either an up direction (increment) or down direction (decrement). Such an operation can be an update cycle or update mode operation.

Referring still to FIG. 13, during an update mode operation, an SAR/Counter (1316-0 and/or 1316-1) can operate as an up-down counter according to an output of comparator 1308. A PU array 1302-0 can be updated first, with a resulting code being applied to PU array 1302-1. A PD array 1304 can then be updated. In more detail, during an update operation of a PU array 1302-0, if an output of comparator 1308 is '1', indicating that there has been some decrease in the impedance of the PU array 1302-0, pull-up binary code (pu_dac[k:0]) can be decremented by 1. Conversely, if an output of comparator 1308 is '0', indicating an increase in the impedance of PU array 1302-0, pull-up binary code (pu_dac[k:0]) can be incremented by 1. Once a pull-up binary code is updated, a pull-down binary code (pd_dac[k:0]) can be updated in the same general way. Such codes values can then be forwarded to actual I/Os of the device.

As noted briefly above, the arrangement of FIG. 13 shows an example in which a binary output code of k+1 bits is generated, but only k such bits are used as values to provide impedance matching at actual I/Os. That is, an LSB bit of binary output codes (pu_dac [k:0] and pd_dac [k:0]) can be dropped and the remaining k bits (pu_dac[k:1] and pd_dac [k:1] are stored in final update registers (1322-0 and 1322-1) and then provided to I/O driver circuits.

The dropping of an LSB can occur in order to reduce noise in a VIS circuit 1300. In the case of frequent update cycles and especially for continuous updates (updates at every clock cycle), an LSB bit within each output code can toggle every update cycle (even if there is no significant temperature or voltage variation). Such a bit can be called a "chatter" bit. A chattering of an LSB bit can cause significant noise in a driver circuit and adversely affect its performance.

Accordingly, in cases where the noise due to the chattering bit dominates the accuracy gained by the 1 LSB, the LSB bit can be dropped and the remaining bits can be utilized to match impedance of actual I/O driver circuits. This can be the same as the I/O driver circuits getting all the bits, but with the last bit (LSB) being always '0' (turned OFF). In FIG. 13, an LSB bit can be dropped only on a final code that is sent to I/O driver circuits and not on the code inside the VIS circuit. Thus, dropping of an LSB bit can have no effect on the general operation of the operation of calibration loops 1312 and 1314.

Referring now to FIG. 14, a conceptual operation of the VIS circuit of FIG. 13 is shown in a flow diagram. FIG. 14 shows an initial calibration cycle, as well as update operations described above. Within the flow diagram 1400, "STEP B1" refers to implementation of a binary search SAR technique during an initial calibration cycle. STEP B2 refers to the operation of dropping an LSB bit from resulting binary codes. STEP B3 represents an up/down counter operation during an update operation. STEP B4 represents the operation of dropping the LSB bit during an update operation While the conventional arrangement shown in FIGS. 13 and 14 can provide adequate results under some operating conditions, such an arrangement can have drawbacks.

First, an input offset voltage can be a significant source of error in the VIS circuit 1300. An input offset voltage can arise from numerous sources, including but not limited to an input offset at the inputs of comparator 1308, an error in reference voltage Vref, and/or an overdrive voltage of the comparator 1308. Thus, as the accuracy requirements for impedance matching become more precise, the error induced due to such an input offset can result in an unacceptably inaccurate response. Still further, the effect of a comparator input offset on overall matching accuracy can increase as the operating supply voltage decreases. As a result, at such lower power supply levels, an offset voltage can become comparable to the resolution of SAR ADC (i.e., be equivalent to 1 LSB).

Second, in the conventional arrangement shown, the VIS circuit 1300 does not differentiate between a positive and negative input offset. However, in such an arrangement a worst-case error is not the same when an input offset is a positive voltage as compared to when an input offset is a negative voltage. In particular, a largest worst-case error can occur when an input offset is a negative voltage. The following discussion illustrates the effect of such input offsets on the accuracy of a conventional VIS circuit 1300.

Referring still to FIG. 14, STEP B1, B2 and B4 will always move the impedance of the array in the downward direction with reference to an external resistor RQ. As a result, following quantization and dropping of an LSB, a conventional VIS circuit 1300 can turn on a smaller (larger) number of legs than an ideal case, thereby setting a resistance of a PU array to a higher (lower) value than a target resistance (RQ).

In the case of a positive input offset, because the direction of the offset is upward, an error contributed due to the input offset is compensated for by the steps moving in the opposite direction. Thus, a worst-case error resulting from a positive comparator input offset can be calculated to be (2LSB−offset), where "offset" in this equation refers to a total error due to the input offset voltage.

In the case of negative input offset, since the direction of the offset is downward, it adds to the error contributed by the above described steps. As a result, a worst-case error can be calculated to be (2LSB+offset).

Details of the above error calculation are shown in FIG. 15. FIG. 15 is a graphical illustration showing propagation of the worst-case error due to the input offset voltage during STEP B1 through STEP B4 shown in FIG. 14. Solid horizontal lines labeled as "RQ" represent a target impedance (e.g., system trace impedance) to be matched. Top waveforms 1500 shows a worst-case error when an input offset is positive, and bottom waveforms 1502 show a worst-case error when an input offset is negative.

Referring still to FIG. 15, STEP B1 represents a VIS circuit implementing the SAR technique to successively turn on legs (e.g., bits) in a PU array until the comparator trips. When the comparator trips, the SAR can reset back to the previous step. Accordingly, a maximum error that can occur with such an operation can be 1 LSB. Such an error can occur when a target value RQ is actually close to the bit that causes the comparator to trip.

STEP B2 represents the operation of dropping an LSB. Such a step can introduce a maximum error of 1 LSB. Thus, a resistance at the end of STEP B2 can represent an actual selected resistance for I/O driver arrays during an initial calibration cycle.

As can be seen from the waveform sets of FIG. 15, in the case of a positive input offset, STEP B1 and STEP B2 can both move in direction opposite to the direction of the offset. As a result, the effect of the error due to the input offset can be "(2LSB−offset)" during an initial calibration cycle.

In contrast, in the case of a negative input offset, both STEP B1 and STEP B2 can move in the same direction as the input offset, thereby adding to the resulting error. As a result, a worst-case error with a negative input offset can be "(2LSB+offset)" during the initial calibration cycle.

As noted above, once an initial calibration cycle is complete, output codes can be adjusted periodically to account for any variations in temperature or voltage. A maximum allowed variation can be set to 1 LSB. Thus, such variations can cause an impedance established by the above steps to drift up (a decrease in the resistance of the PU/PD array) or drift down (increase in the resistance of the PU/PD array) by a maximum of 1 LSB.

Referring still to FIG. 15, during STEP B3, a comparator can re-evaluate an output code to determine a direction of a drift, and move a code count 1 LSB in a direction that compensates for such drift. FIG. 15 shows error propagation for both possible update cases (Drift-Up and Drift-Down). A maximum error that can occur during STEP B3 can be +1 LSB, in the case of downward drift, and −1 LSB, in the case of an upward drift, because a counter can be set to change a code value by only 1 LSB bit, either up or down.

STEP B4 represents the dropping of an LSB during an update operation. A maximum error during this operation can be 1 LSB. As can be seen in FIG. 15, a worst-case error during an update operation can be (2LSB−offset) in the case of a positive offset (1500) and (2LSB+offset) in the case of a negative offset.

To summarize, a worst-case error in the conventional VIS circuit 1300 can be 2LSB−offset, in the case of a positive input offset, and 2LSB+offset, in the case of a negative input offset. These results are further summarized in the table shown in FIG. 16.

In light of the above, it would be desirable to arrive at a circuit and/or method of variable input sensing that can take into account any input offset inherent in the sensing circuits. Further, it would also be desirable to arrive at a VIS circuit and/or method that can compensate for differences in error arising from the type of inherent offset (e.g., positive or negative) inherent in the sensing circuit.

BRIEF DESCRIPTION OF THE DRAWINGS

FIG. 8 is a table showing worst error cases in a system/method according to an embodiment of the present invention.

FIG. 9 is table comparing systematic and random errors in a system/method according to an embodiment of the present invention to a conventional case.

FIG. 10 is table showing error improvement for various supply levels in a system/method according to an embodiment of the present invention.

FIG. 11 is a table showing one example of error improvement for a system/method according to an embodiment of the present invention.

FIG. 16 is a table showing worst case error for the conventional VIS circuit of FIG. 13.

DETAILED DESCRIPTION

The various embodiments of the present invention are directed to variable impedance sense (VIS) circuits and methods. The disclosed embodiments can compensate for errors arising from offset voltages inherent in the sensing circuitry.

Figure 1:
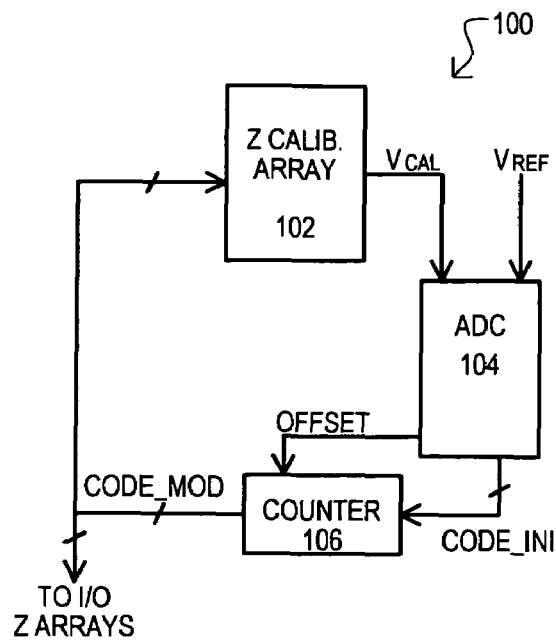
FIG. 1 is a block diagram of a variable impedance sense (VIS) circuit according to a first embodiment of the present invention.

Referring now to FIG. 1, a VIS circuit 100 according to a first embodiment is shown in a block schematic diagram. A VIS circuit 100 can include a calibration impedance array 102, an analog-to-digital converter (ADC) circuit 104, and a counter circuit 106. An impedance (Z) calibration array 102 can provide a variable impedance based on a received input code CODE_MOD. An ADC circuit 104 can receive a calibration voltage ($V_{CAL}$) from Z calibration array 102 and a reference voltage ($V_{REF}$). ADC circuit 104 can generate an initial digital code value CODE_INI corresponding to a received calibration voltage ($V_{CAL}$). Initial code value CODE_INI can be provided to a counter circuit 106.

Figure 13:
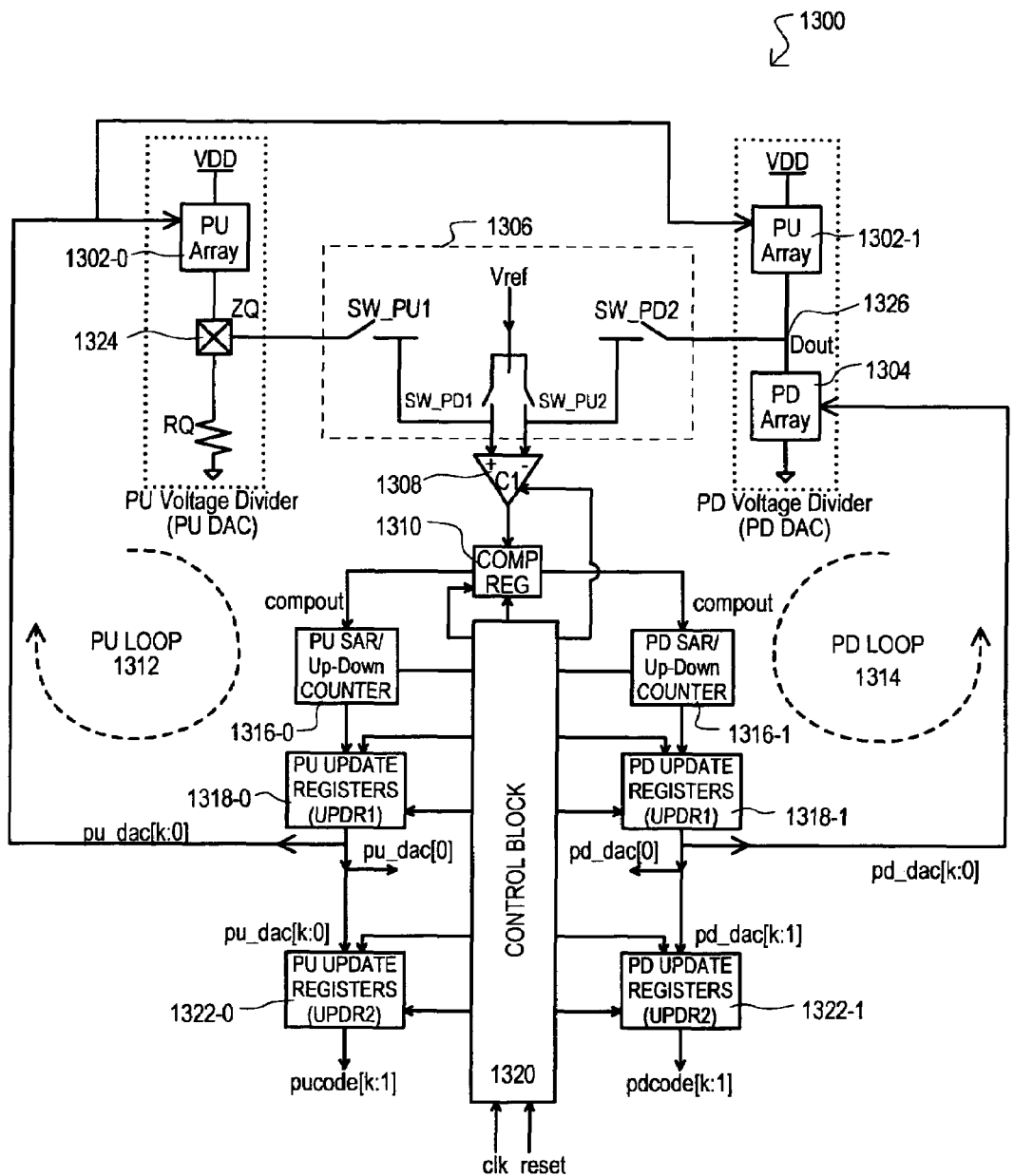
FIG. 13 is a schematic diagram of a conventional VIS circuit.

Unlike a conventional arrangement like that of FIG. 13, an ADC circuit 104 can provide an offset value OFFSET. A value OFFSET can represent an offset inherent in an ADC circuit 104. Still further, a counter circuit 106 can modify an initial code value CODE_INI to generate a modified code value CODE_MOD in response to a value OFFSET. As but one particular example, if a value OFFSET has one value, a counter circuit 106 can alter CODE_INI to generate CODE_MOD. However, if a value OFFSET has another value, a counter circuit 106 can leave CODE_INI unaltered to generate CODE_MOD (i.e., CODE_INI=CODE_MOD). A resulting CODE_MOD can be output to input/output (I/O) Z arrays (not shown), to provide matching impedance setting for such Z arrays.

In this way, an inherent offset in an impedance detection circuit can be compensated for by detecting such an offset, and then altering a digital value representing the detected impedance, based on the particular type of offset detected.

Figure 2:
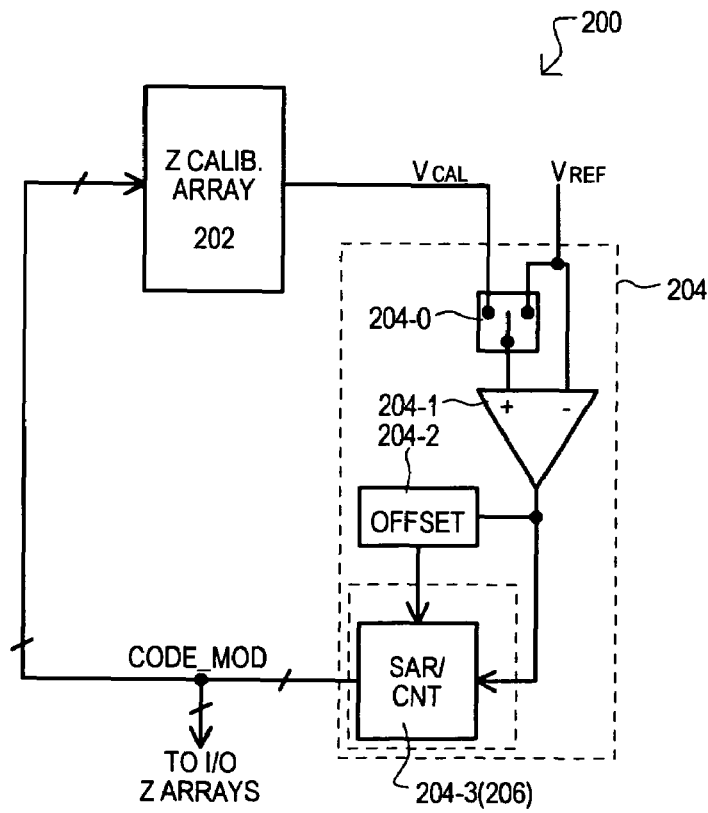
FIG. 2 is a block diagram of a VIS circuit according to a second embodiment of the present invention.

Referring now to FIG. 2, a VIS circuit 200 according to a second embodiment is shown in a block schematic diagram. A VIS circuit 200 can include the same general components as a first embodiment 100, thus like sections are referred to by the same reference character but with a first digit being a "2" instead of a "1".

FIG. 2 shows an example in which an ADC circuit 204 can be a successive approximation register (SAR) type ADC. ADC circuit 204 can include a switch circuit 204-0, a comparator 2041, an offset register 204-2, and an SAR/Counter 204-3.

In operation, a VIS circuit 200 can first couple a reference voltage ($V_{REF}$) to both inputs of comparator 204-1 by operation of switch circuit 204-0, to thereby detect a polarity of any offset. Such a result can be stored in offset register 204-2.

A switch circuit 204-0 can then switch a calibration voltage $V_{CAL}$ into an input of comparator 204-1. SAR techniques can then be used to generate a digital code value representing a reference impedance within Z calibration array 202. An SAR/Counter 204-3 can then modify (or not modify) such a code value based on the value stored in offset register 204-2 to generate a final output code value CODE_MOD. Thus, SAR/Counter 204-3 can also function as a counter circuit 206.

In this way, an inherent input offset in SAR type impedance detection circuit can be compensated for by altering an SAR value based on a detected input offset.

Figure 3:
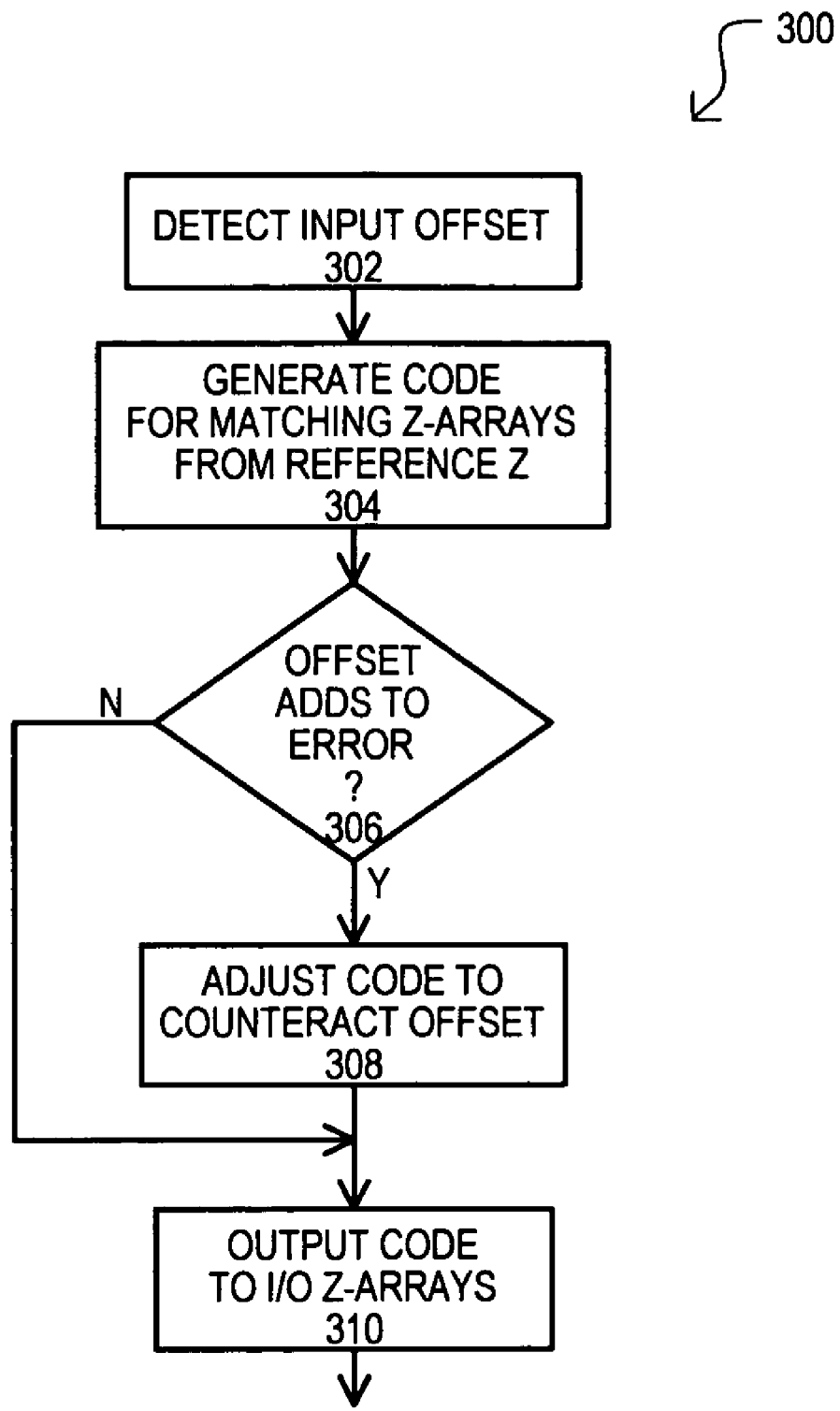
FIG. 3 is a flow diagram of a VIS method according to a third embodiment of the present invention.

While the above embodiments have shown VIS circuits, the present invention can also include methods of variable impedance sensing. One particular example of such a method is shown in FIG. 3. A method 300 can include detecting an input offset (step 302). As but one example, such a step can include applying a same potential to both inputs of comparator. A code can then be generated for Z arrays based on a reference impedance (step 304). Such a step can include any of a number of analog-to-digital conversion techniques, preferably SAR techniques.

A determination can then be made as to whether an offset adds to an error present in the circuit (step 306). As but one example, such a step can include determining a polarity of a detected offset. If the offset does not add to error (N from 306), a method 300 can output a resulting code to input/output (I/O) Z arrays (step 310). If the offset does add to error (Y from 306), a method 300 can adjust a code to counteract the effects of the offset (step 308). Such a step can include incrementing (or in other architectures, decrementing) a code value by one or more bits, preferably by only one bit. A resulting adjusted code can then be output to I/O Z arrays (step 310).

In this way, offset contributions to errors in an impedance setting code can be automatically compensated for by altering such a code in the event of a particular offset type.

Figure 4:
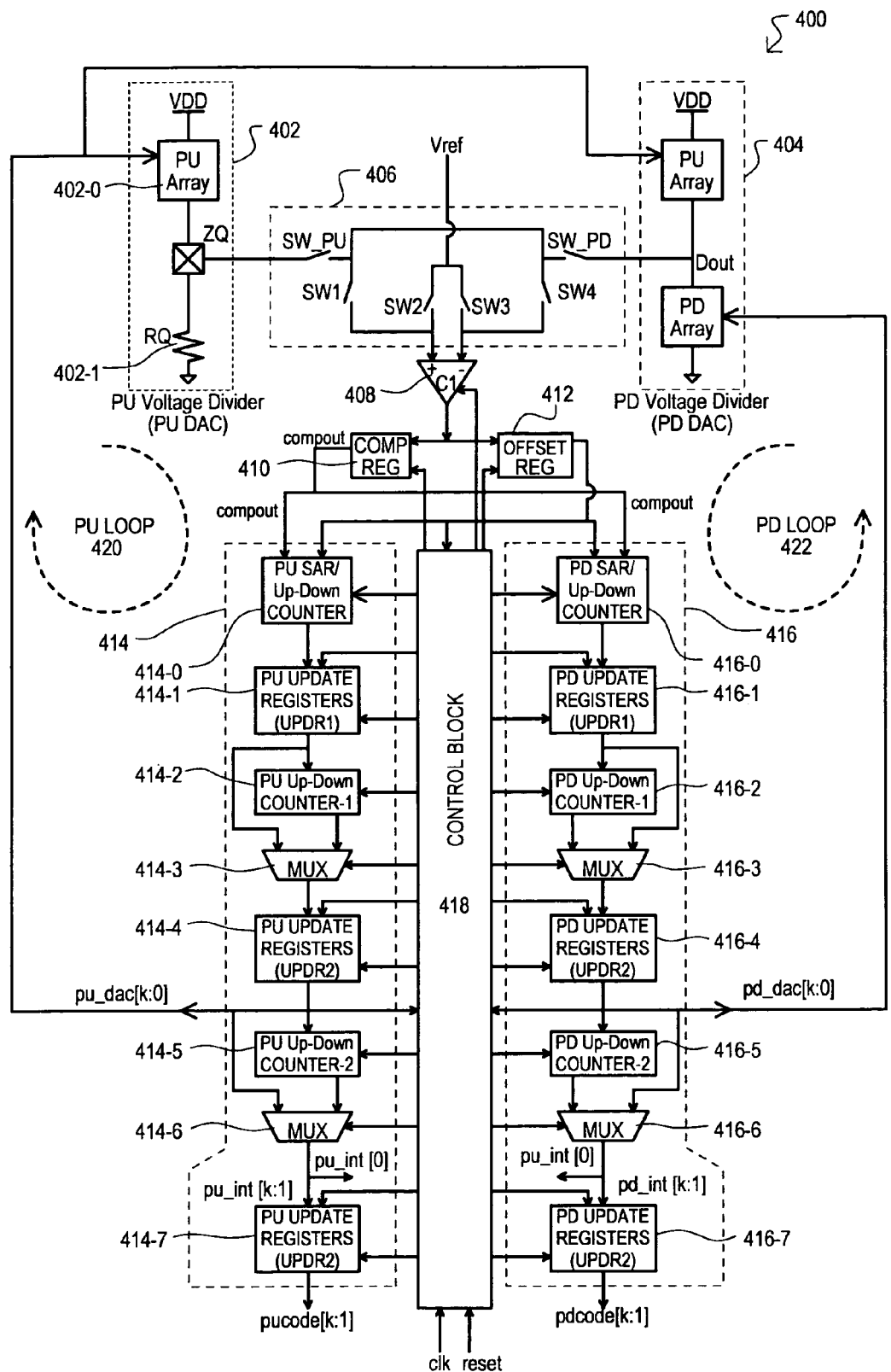
FIG. 4 is a block diagram of a VIS circuit according to a fourth embodiment of the present invention.

Referring now to FIG. 4, a detailed example of a VIS circuit 400 is shown in a block schematic diagram. A VIS circuit 400 can include a pull-up (PU) array section 402, a pull-down (PD) array section 404, a switch section 406, a comparator 408, a comparator register 410, and an offset register 412. In addition, a VIS circuit 400 can include PU circuitry 414 and PD circuitry 416, both of which can be controlled by a control block 418.

A PU loop 420 can be formed by PU array section 402, switch circuit 406, a comparator 408, comparator register 410, offset register 412, and PU circuitry 414, as controlled by control block 418. A PD loop 422 can be formed by PD array section 404, switch circuit 406, a comparator 408, comparator register 410, offset register 412, and PD circuitry 416, as controlled by control block 418.

A VIS circuit 400 can add a digital correction mechanism based on the direction of an input offset voltage. Thus, as compared to the conventional approach of FIG. 13, a new offset detection cycle can be added. During such a detection cycle, a direction (e.g., polarity) of an input offset can be detected. As noted above, an input offset voltage can include, but is not necessarily limited to, an input offset at the inputs of comparator 408, an error in a reference voltage Vref, and/or error resulting from an overdrive voltage of the comparator 408.

Unlike a conventional approach like that of FIG. 13, in FIG. 4 a value representing an input offset can be captured in offset register 412. Such a captured value can then be used to control the operation of control block 418.

Still further, a VIS circuit 400 can include up-down counters (or counter functions) 414-2 and 414-5 within PU circuitry 414, and up-down counters 416-2 and 416-5 within PD circuitry 416. While such counters are shown as separate structures in FIG. 4, such counters can be shared with an existing SAR/Counter. One such embodiment is shown in further detail below.

Such up-down counters can modify a code value to counteract the effect of an input offset. More particularly, such counters can modify a count value when an input offset has a particular polarity. As a result, multiplexers (MUXs) (414-3, 414-6, 416-3 and 416-6) can be included to enable either a modified count value or unmodified count value to be output. The VIS circuit 400 also includes registers 414-4 and 4164 for capturing a code value for application to PU array section 402 and PD array section 404, respectively.

The operation of VIS circuit 400 will now be described.

A VIS circuit 400 can execute an offset detection cycle. During such an offset detection cycle, switch elements SW2 and SW3 within switch circuit 406 can be closed (i.e., low impedance state). During the same cycle, switch elements SW1, SW4, SW_PU and SW_PD within switch circuit 406 can be open (i.e., high impedance state). In such an arrangement a reference voltage $V_{REF}$ can be connected to both the terminals of a comparator 408. In the particular example shown, if a comparator output is high, a negative offset can be detected (neg_offset=1). If a comparator output is low, a positive offset is detected (neg_offset=0). Offset register 412 can be clocked with a control signal from control block 418, and such an offset value can be captured with the register and provided to a control block 418.

A control block 418 can use an offset value to control the control logic such that the worst-case error can be optimized for positive and/or negative offsets of the comparator, or both.

A VIS circuit 400 can also execute calibration operations for both a PU loop 420 and PD loop 422. In a calibration of PU loop 420, switch elements SW_PU, SW1 and SW3 within switch circuit 406 can be closed and switches SW_PD, SW2 and SW4 within switch circuit 406 can be open. In a calibration of PD loop 422, switch elements SW_PD, SW2 and SW4 can be closed while switches SW_PU, SW1 and SW3 can be open.

Unlike the conventional case of FIG. 13, a count value generated during the calibration of PU and PD loops (420 and 422) can be selectively adjusted based on the captured offset value. How such adjustments are made will be described with reference to FIG. 5.

Figure 5:
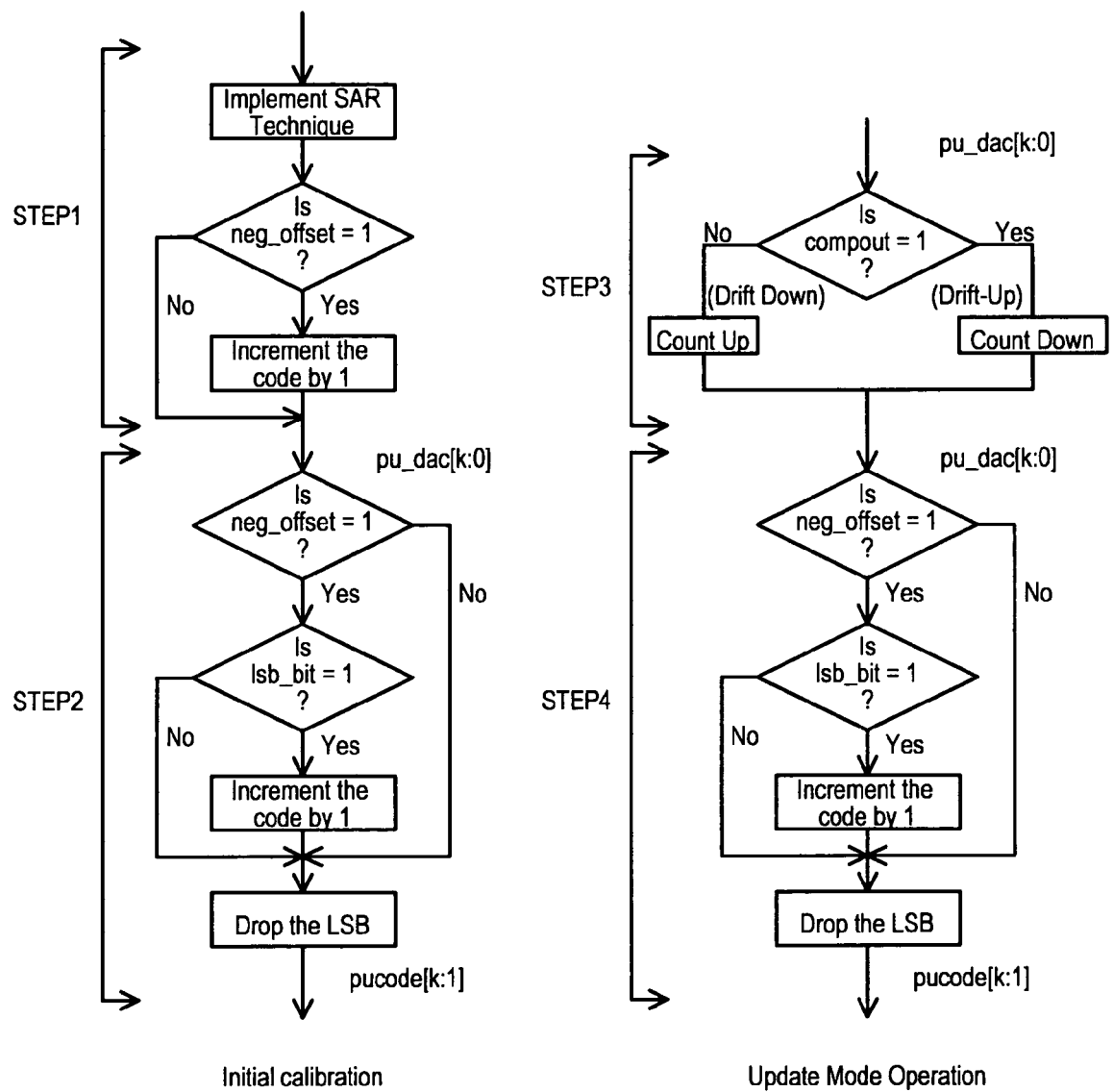
FIG. 5 is a flow diagram of a VIS method according to a fifth embodiment of the present invention.

FIG. 5 is a flow diagram showing the operational flow of VIS circuit 400 shown in FIG. 4.

In a STEP 1, a VIS circuit 400 can implement a conventional SAR technique to arrive at an initial code value. Such a SAR technique can utilize comparator 408 to compare reference voltage (Vref) to a voltage at reference node ZQ created by a voltage divider formed from switched impedance elements within PU array 402-0 and reference impedance RQ. Results of such comparisons can be stored within comparator register 410.

Figure 14:
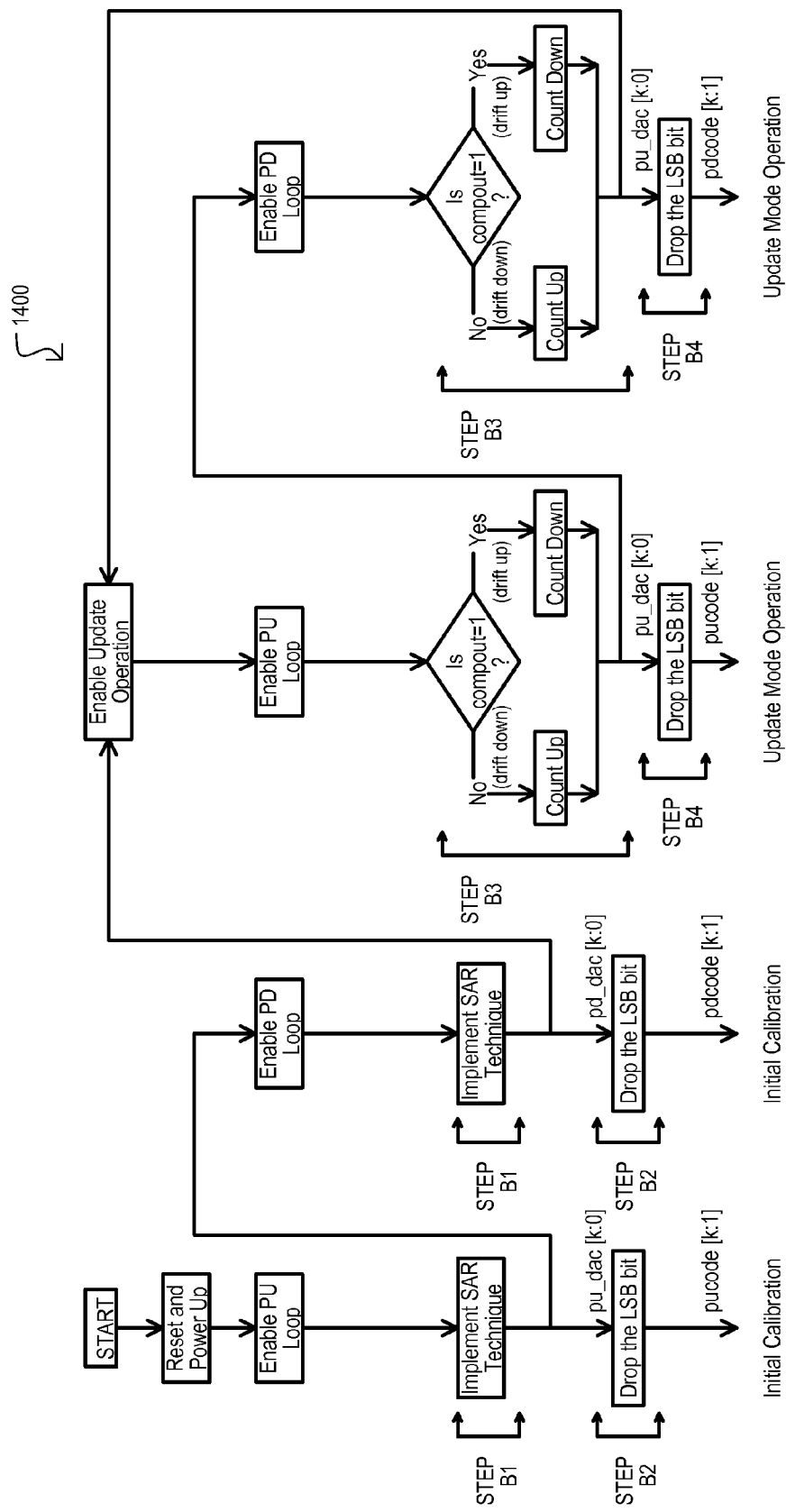
FIG. 14 is a flow diagram describing the operation of the conventional VIS circuit of FIG. 13.
Figure 15:
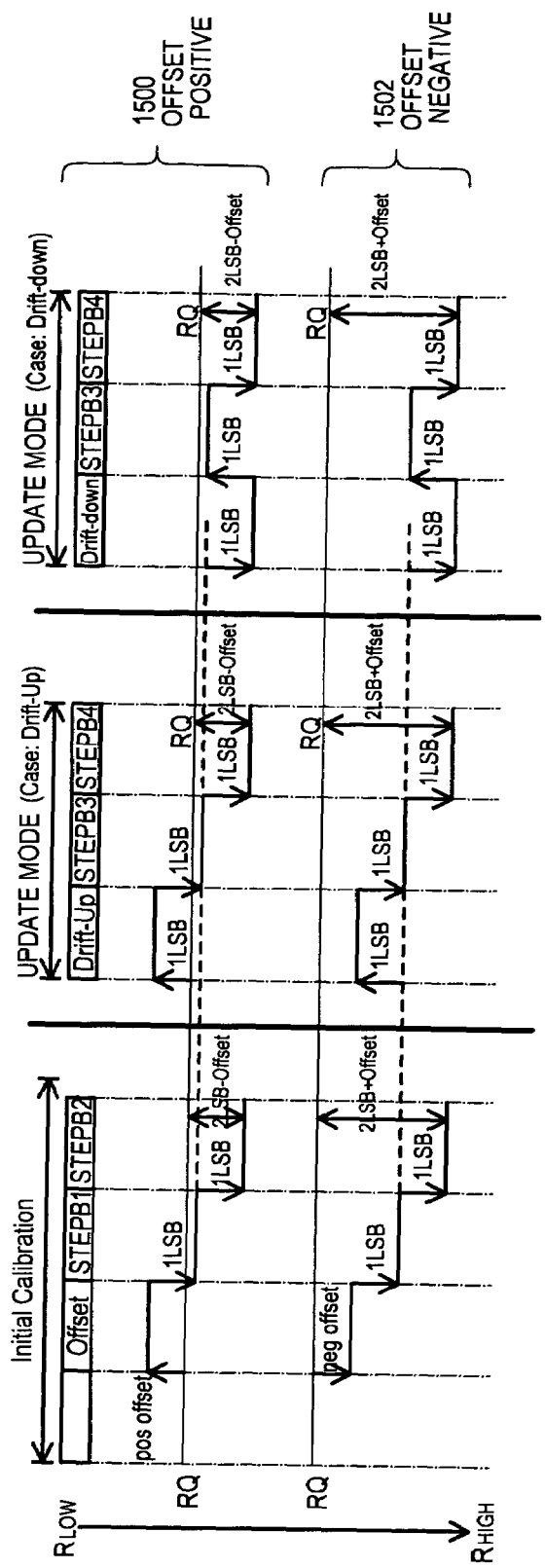
FIG. 15 is a graphical illustration of the propagation of error due to positive and negative offsets for the conventional VIS circuit of FIG. 13.

Unlike a conventional approach, such as that shown in FIG. 14, a STEP 1 can also include determining if an input offset has a negative polarity. If this is the case, following the completion of the SAR technique, a final code can be incremented by 1. Such an operation can ensure that a final code can always be at a maximum distance of 1 LSB above an actual code corresponding to RQ. Such a step can include up-down counter 414-2 (or 416-2 in the PD loop 422) incrementing a code value when a negative input offset is detected. MUX 414-3 can output the incremented (e.g., modified or adjusted) code if a negative input offset has been detected, and can output an unmodified code if a negative input offset has not been detected.

STEP 2 shows the operation of dropping an LSB of a final code. Unlike a conventional approach, such as that shown in FIG. 14, a STEP 2 can again include determining if an input offset has a negative polarity. If this is the case, the LSB of the final code generated by STEP 1 can be examined to see if it is a "1". If the LSB of the final updated code is a '1' and the input offset is negative, the code can be further incremented by 1. Such a step can include up-down counter 414-5 (or 416-5 in the PD loop 422) incrementing a code value when the LSB is one and a negative input offset is detected. MUX 414-6 (or 416-6 in the PD loop 422) can output the incremented (e.g., modified or adjusted) code if the LSB is one and a negative input offset is detected, and can output a previous generated code if a negative input offset has not been detected or the code does not have an LSB of 1. An LSB of a code output from MUX 414-6 (or 416-6 in the PD loop 422) can then be dropped. A resulting value can then be stored in an appropriate final update register (414-7 and 416-7). A resulting code from STEP 2 can then be used to turn on the equivalent number of legs in the input/output driver array.

Such an arrangement can, in this negative input offset case, move a worst-case distance of 1 LSB above an actual final code at the end of STEP 1 operation, instead of moving 1 LSB below as in the conventional case.

STEP 3 shows an update operation. During this operation, a final code from STEPS 1-2 can be either incremented or decremented by a maximum of 1 LSB according to an output of a comparator. Such an operation can account for variations arising from changes in operating conditions (e.g., temperature and/or supply voltage).

STEP 4 shows a dropping of an LSB following an update operation. Unlike a conventional approach, such an operation can be essentially the same as that of STEP 2 above. An LSB of the final code generated by STEP 3 can be examined to see if it is a "1". If the LSB of the updated code is a '1', and the input offset is negative, the updated code can be further incremented by 1. The LSB of the resulting code can then be dropped.

Such an arrangement can, in this negative input offset case, result in the updated code moving a maximum distance of 1 LSB above the actual final code at the end of STEP 3 operation, instead of moving 1 LSB below, as in the conventional approach. A resulting code from STEP 4 can then be used to turn on the equivalent number of legs in the input/output driver array.

Of course, FIG. 4 represents but one embodiment of the present invention. Other embodiments can include the combining or otherwise re-arranging of functional blocks. One such arrangement is shown in FIG. 6.

Figure 6:
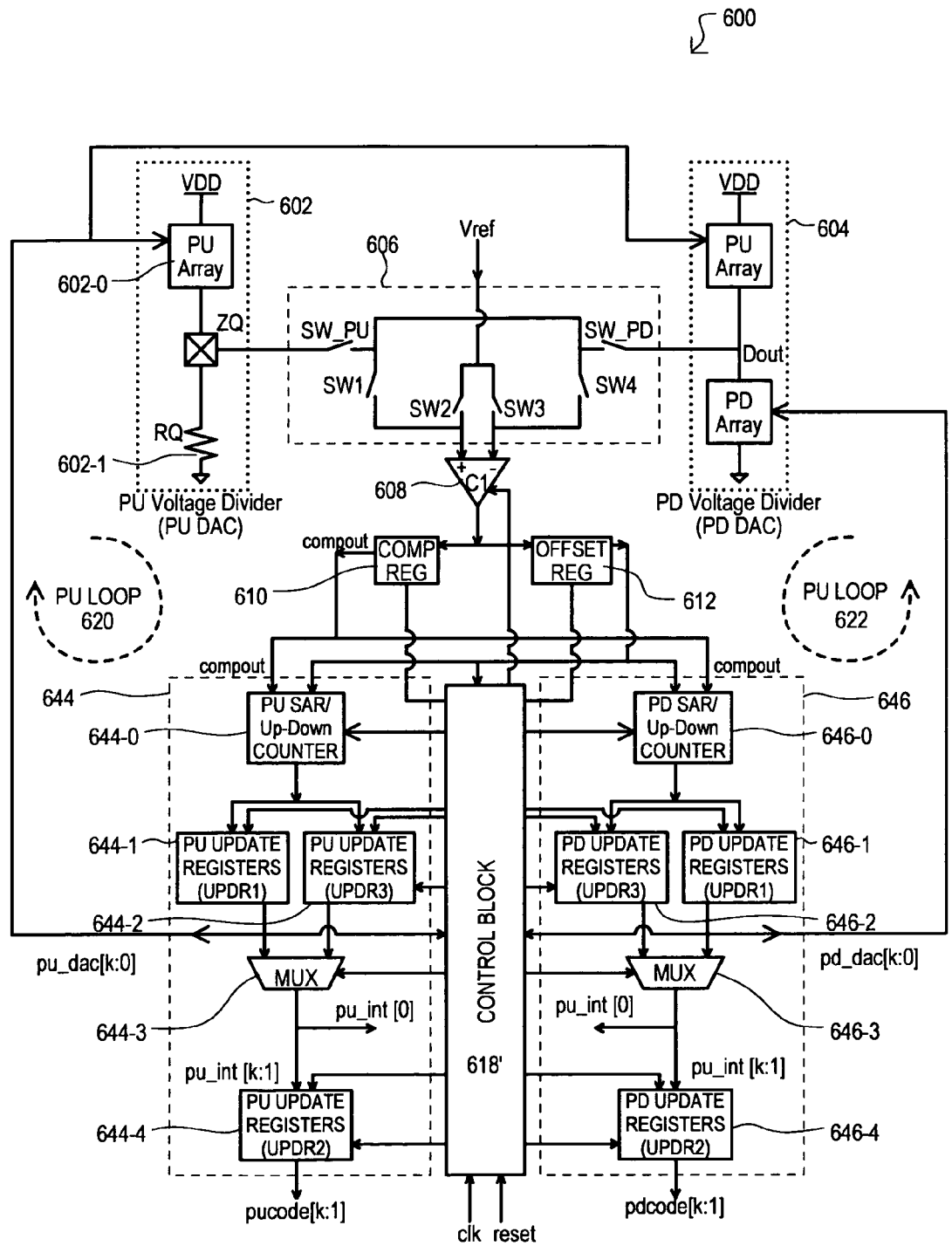
FIG. 6 is a block diagram of a VIS circuit according to a sixth embodiment of the present invention.

FIG. 6 shows a detailed example of a VIS circuit 600 in a block schematic diagram. A VIS circuit 600 can include some of the same general sections as FIG. 4, thus like sections are referred to by the same reference character but with the first digit being a "6" instead of a "4".

In the arrangement of FIG. 6, up-down counters and MUXs can be re-arranged as shown in FIG. 6 to minimize the additional hardware added over a conventional VIS circuit. The embodiment of FIG. 6 can result in the addition of: an offset detect register (612), update registers (644-2/646-2), and a MUX (644-3/646-3) to provide the ability to share an existing SAR/Counter (644-0/646-0).

In this way, a VIS circuit 600 can have a more compact structure.

Advantages of the particular arrangement described with reference to FIGS. 4 through 6 are demonstrated in FIG. 7.

Figure 7:
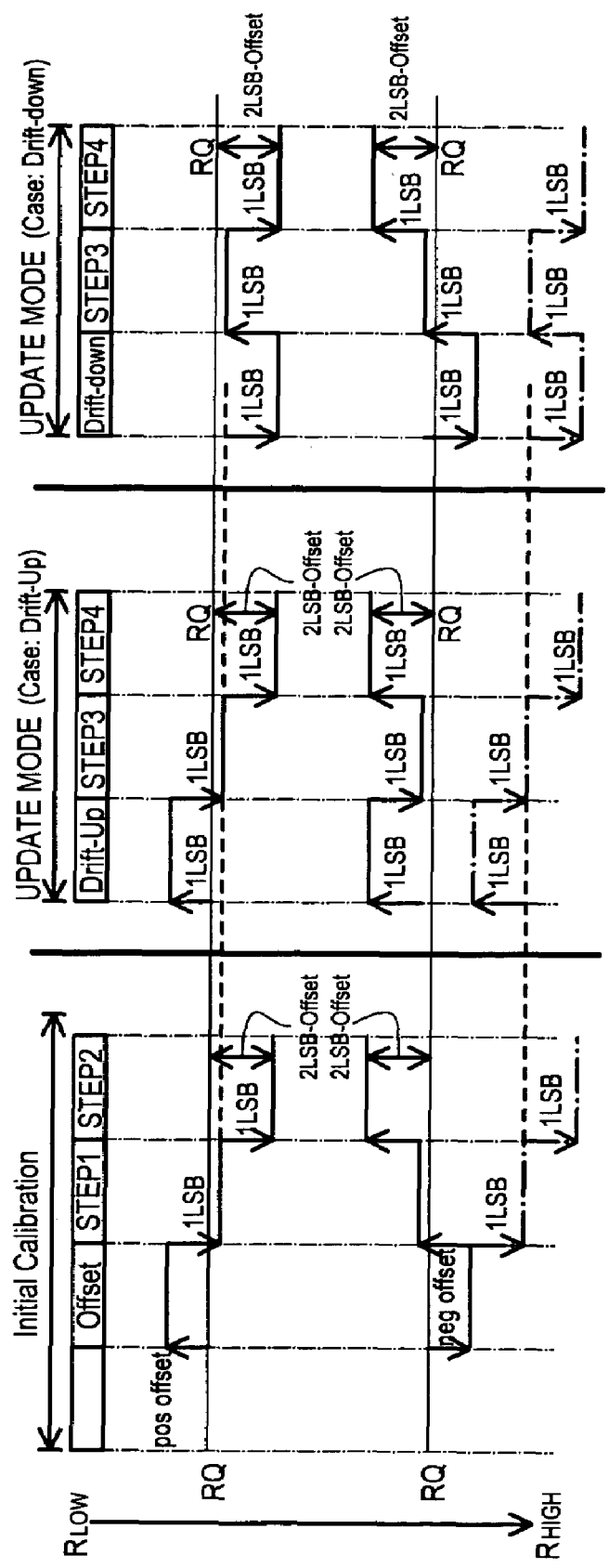
FIG. 7 is a diagram showing error propagation in a system/method according to an embodiment of the present invention.

FIG. 7 shows the propagation of the worst-case error in architecture/method like that of FIGS. 4 through 6. As can be seen from the waveforms in FIG. 7, STEP 1 and STEP 2 can always move in the direction opposite to the direction of a detected input offset. A worst-case error during a normal mode operation can be (2LSB−offset) for both positive and negative comparator input offsets. This is in contrast to (2LSB+offset), in a conventional case having negative input offset.

Further, a worst-case error during update mode operation can also be (2LSB−offset) in case of both positive and negative comparator input offset. Again, this is in contrast to (2LSB+offset), in a conventional case having negative input offset.

A VIS circuit according to the above embodiments can provide an advantageously simple digital calibration technique for correcting the error due to comparator input offset voltage. This is in contrast to conventional compensation schemes that can include a switched capacitor circuit, which can add complexity and require large capacitors. Large capacitors can be expensive in terms of area needed in an integrated circuit design. Unlike a switched capacitor compensation approach, calibration techniques according to the above embodiments can be implemented with logic, requiring substantially less area as compared to switched capacitor schemes.

As has been demonstrated, in a VIS circuit and method according to the above embodiments, an overall worst-case error can be reduced from (2LSB+offset) to (2LSB−offset). This can provide an improvement of (2*offset) in an overall error budget. These improvements are shown in the table of FIG. 8. It is noted that such error improvement is in the systematic component of the error, and the random component of the worst-case error is unchanged.

A VIS circuit and/or method according to the above embodiments can also improve matching accuracy with a reference impedance (e.g., a pull-down PD-RQ) by 1 LSB. This is shown the table of FIG. 9.

As noted previously, decreases in a power supply voltage can increase the effect of input offsets in error generation. FIG. 10 shows a table that illustrates error improvement that can occur according to the embodiments of the invention as a function of a supply voltage (e.g., input/output supply voltage). The calculations of FIG. 10 are based on a comparator input offset of +/−5 mV and an overdrive voltage of 0.5 mV.

As can be seen from the table of FIG. 10, an absolute error improvement can be as high as 3% for a 1.2 V supply. This can translate into a reduction of about 20% of the overall error budget for a 15% specification (spec) and about 33.33% reduction in the overall error budget for a 10% spec. FIG. 11 shows a table illustrating an example data for a device supporting a low voltage transistor-transistor logic (LVTTL) and high speed transceiver logic (HSTL) I/O standard.

Figure 12A:
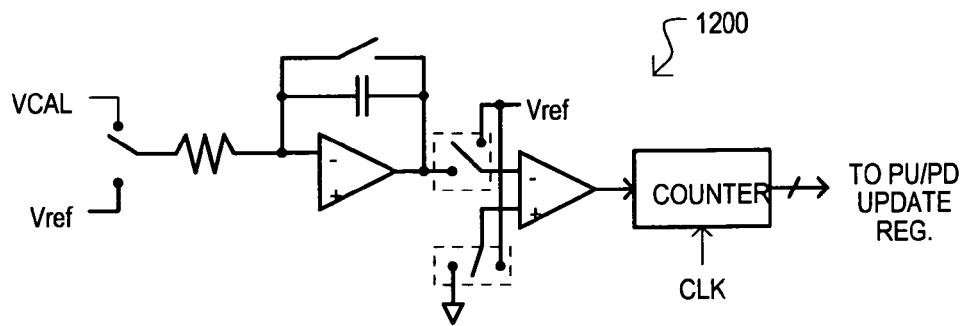
FIGS. 12A to 12C are block schematic diagram of examples of analog-to-digital converters (ADCs) that can be used in alternate embodiments of the present invention.
Figure 12B:
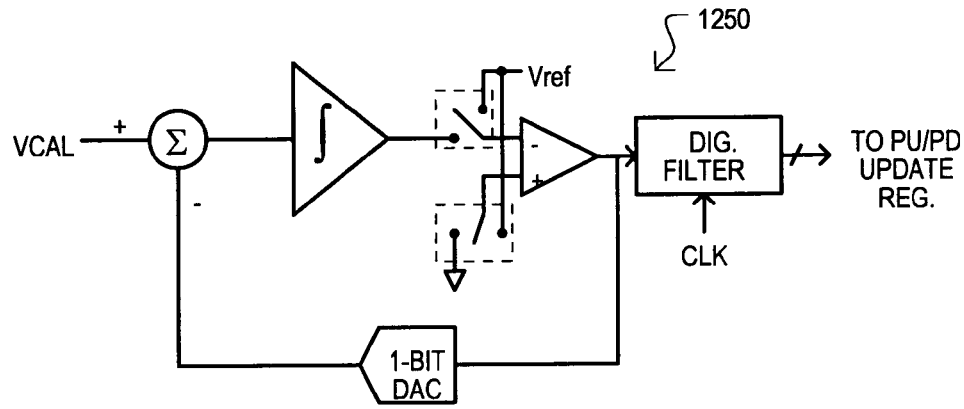
Figure 12C:
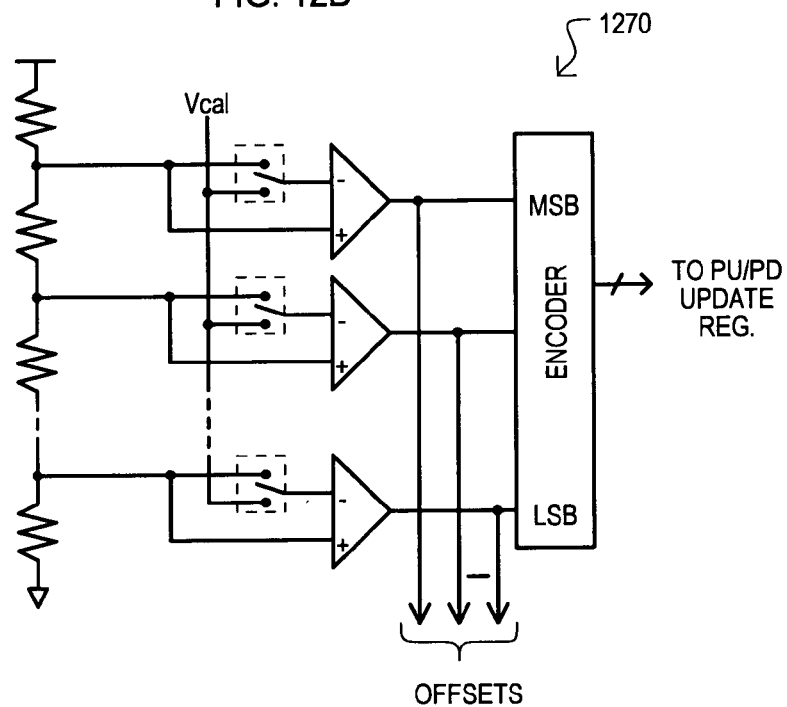

As noted previously, the present invention can encompass a wide variety of embodiments, thus the disclosed embodiments should not necessarily be construed as being limiting to the invention. As but one example, other embodiments can utilize different ADC techniques for generating an impedance establishing code that may (or may not) be altered in response to a detected input offset. FIGS. 12A to 12C show three of the many alternate ADC approaches that can be utilized in alternate embodiments. FIG. 12A shows a standard integrator type ADC. FIG. 12B shows a "sigma-delta" type ADC. FIG. 12C shows a resistor ladder type ADC. Variations on such basic approaches are well known by those skilled in the art.

For ADC techniques utilizing multiple comparators, an input offset value can be generated based on the effect on each such comparator, or may be generated based on a summed average input offset at such comparator inputs. In the latter case, multiple offset registers can be employed for each comparator.

It is understood that the embodiments of the invention may be practiced in the absence of an element and or step not specifically disclosed. That is, an inventive feature of the invention can be elimination of an element or step.

It should be appreciated that reference throughout this specification to "one embodiment" or "an embodiment" means that a particular feature, structure or characteristic is described in connection with the embodiment is included in at least one embodiment of the present invention. Therefore, it is emphasized that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present invention.

Similarly, while the various aspects of the particular embodiments set forth herein have been described in detail, the present invention could be subject to various changes, substitutions, and alterations without departing from the spirit and scope of the invention.

What is claimed is:

1. A variable impedance sense circuit, comprising:
a comparator having at least one input coupled to a first array of switchable impedance elements;
an offset value circuit that provides an offset value corresponding to an input offset voltage from at least one input of the comparator; and
a counter circuit that receives impedance calibration bit values from the comparator, the counter circuit outputting an initial set of calibration bit values when the offset value has one predetermined value, and outputting modified calibration bit values, by modifying the initial set of calibration bit values, when the offset value has another predetermined value.

2. The variable impedance sense circuit of claim 1, wherein:
the offset value circuit comprises an offset value register, and the offset value is a single bit binary value reflecting a polarity of the input offset voltage.

3. The variable impedance sense circuit of claim 1, wherein:
the counter circuit is a successive approximation register that sequentially sets bit values according to output values from the comparator, starting with a most significant bit and ending with a least significant bit.

4. The variable impedance sense circuit of claim 1, further including:
the first array of switchable impedance elements comprises a pull-up array coupled between a calibration node and a high power supply node and coupled to receive a calibration bit values from the counter circuit; and
a switch circuit that couples the calibration node to an input of the comparator.

5. The variable impedance sense circuit of claim 4, further including:
a second pull-up array coupled to the high power supply node and coupled to receive the calibration bit values from the counter circuit.

6. The variable impedance sense circuit of claim 1, further including:
the first array of switchable impedance elements comprises a pull-down array coupled between a calibration node and a low power supply node and coupled to receive calibration bit values from the counter circuit; and
a switch circuit that couples the calibration node to an input of the comparator.

7. The variable impedance sense circuit of claim 1, further including:
the comparator has a first input and a second input; and
a switch circuit having a first switch element that provides a controllable path between the comparator first input and a reference voltage and a second switch element that provides a controllable path between the comparator second input and the reference voltage.

8. The variable impedance sense circuit of claim 1, wherein:
the counter circuit includes
a first counter that outputs the initial set of calibration bit values,
a second counter that outputs the modified calibration bit values, and
a multiplexer selectively outputs the set of calibration bit values or the modified calibration bit values.

9. The variable impedance sense circuit of claim 1, wherein:
the modified calibration bit values comprises the initial set of calibration bit values incremented by one.

10. A method of sensing an impedance value for I/O matching that can compensate for an input offset voltage, comprising the steps of: detecting the polarity of an input offset voltage from at least one input of a comparator by switching a reference voltage to both inputs of the comparator and storing an output value from the comparator; generating a digital value corresponding to a reference impedance with an analog-to-digital conversion using the comparator; and adjusting the digital value according to the polarity of the input offset voltage.

11. The method of claim 10, wherein:

adjusting the digital value includes, if the offset voltage has one polarity type, incrementing the digital value by one.

12. The method of claim 11, wherein:

the polarity type is a negative input offset voltage that generates a high output at the comparator when the comparator inputs receive the same reference voltage.

13. The method of claim 11, wherein:

the digital value is a binary value having a least significant bit (LSB); and adjusting the digital value further includes, if the offset voltage has one polarity type and incrementing the digital value by one results in the LSB being one, then incrementing the digital value by one again.

14. The method of claim 10, further including:

generating the digital value includes activating impedance devices in a pull-up array that is coupled between a reference impedance and a high power supply voltage.

15. The method of claim 10, further including:

generating the digital value includes activating impedance devices in a pull-down array that is coupled between a pull-up array and a low power supply voltage.

16. A variable impedance sensing architecture, comprising:

an offset register for storing an offset value corresponding to at least an input offset voltage at an input of a comparator;

a control block coupled to the offset register that outputs an offset indication according to the offset value; and a counter circuit that adjusts a binary value generated by successive approximations in response to a predetermined offset indication value.

17. The variable impedance sensing architecture of claim 16, further including:

the counter circuit increments the binary value in response to the predetermined value of the offset indication to generate a first modified binary value.

18. The variable impedance sensing architecture of claim 17, wherein:

the control block is coupled to receive the first modified binary value and outputs a count adjust indication when the first modified binary value has a least significant bit of one; and the first counter circuit increments the first modified binary value in response to a predetermined value of the count adjust indication to generate a second modified binary value.

19. The variable impedance sensing architecture of claim 16, further including:

a first pull-up array coupled between a reference node and a high power supply voltage; and a switch circuit having a plurality of switch paths that can be switched between a high impedance and low impedance state, the switch paths including a first switch path coupled between the reference node and a first input of the comparator, a second switch path coupled between a reference voltage and the first input of the comparator, and a third switch path coupled between the reference voltage and a second input of the comparator.

* * * * *